US010529573B2

(12) United States Patent
Ando et al.

(10) Patent No.: US 10,529,573 B2
(45) Date of Patent: Jan. 7, 2020

(54) FORMATION OF PURE SILICON OXIDE INTERFACIAL LAYER ON SILICON-GERMANIUM CHANNEL FIELD EFFECT TRANSISTOR DEVICE

(71) Applicant: International Business Machines Corporation, Armonk, NY (US)

(72) Inventors: Takashi Ando, Tuckahoe, NY (US); Pouya Hashemi, White Plains, NY (US); Hemanth Jagannathan, Niskayuna, NY (US); Choonghyun Lee, Rensselaer, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/950,773

(22) Filed: Apr. 11, 2018

(65) Prior Publication Data

US 2018/0233369 A1    Aug. 16, 2018

Related U.S. Application Data

(62) Division of application No. 15/262,206, filed on Sep. 12, 2016, now Pat. No. 10,008,386.

(51) Int. Cl.
*H01L 29/66*    (2006.01)
*H01L 29/78*    (2006.01)
(Continued)

(52) U.S. Cl.
CPC .. *H01L 21/28255* (2013.01); *H01L 21/02236* (2013.01); *H01L 21/02247* (2013.01);
(Continued)

(58) Field of Classification Search
CPC .................................. H01L 29/66545
See application file for complete search history.

(56) References Cited

U.S. PATENT DOCUMENTS 9,466,492 B2   10/2016  Ando et al.
2002/0017644 A1*  2/2002  Fitzgerald ....... H01L 21/823412
                                                  257/69

(Continued)

FOREIGN PATENT DOCUMENTS

CN        101728257 A     6/2010

OTHER PUBLICATIONS

English translation for China Application No. CN101728257.
(Continued)

*Primary Examiner* — Moazzam Hossain
(74) *Attorney, Agent, or Firm* — Vazken Alexanian; Ryan, Mason & Lewis, LLP

(57) ABSTRACT

Methods are provided to form pure silicon oxide layers on silicon-germanium (SiGe) layers, as well as an FET device having a pure silicon oxide interfacial layer of a metal gate structure formed on a SiGe channel layer of the FET device. For example, a method comprises growing a first silicon oxide layer on a surface of a SiGe layer using a first oxynitridation process, wherein the first silicon oxide layer comprises nitrogen. The first silicon oxide layer is removed, and a second silicon oxide layer is grown on the surface of the SiGe layer using a second oxynitridation process, which is substantially the same as the first oxynitridation process, wherein the second silicon oxide layer is substantially devoid of germanium oxide and nitrogen. For example, the first silicon oxide layer comprises a SiON layer and the second silicon oxide layer comprises a pure silicon dioxide layer.

9 Claims, 7 Drawing Sheets

(51) Int. Cl.
*H01L 29/51* (2006.01)
*H01L 29/161* (2006.01)
*H01L 21/28* (2006.01)
*H01L 21/02* (2006.01)
*H01L 21/84* (2006.01)
*H01L 29/49* (2006.01)

(52) U.S. Cl.
CPC .. *H01L 21/02255* (2013.01); *H01L 21/02326* (2013.01); *H01L 21/845* (2013.01); *H01L 29/161* (2013.01); *H01L 29/4966* (2013.01); *H01L 29/513* (2013.01); *H01L 29/66545* (2013.01); *H01L 29/66575* (2013.01); *H01L 29/66795* (2013.01); *H01L 29/78* (2013.01); *H01L 29/785* (2013.01)

(56) References Cited

U.S. PATENT DOCUMENTS

| | | |
|---|---|---|
| 2006/0131672 A1 | 6/2006 | Wang et al. |
| 2007/0170541 A1 | 7/2007 | Chui et al. |
| 2008/0121932 A1* | 5/2008 | Ranade ............ H01L 21/28255 257/192 |
| 2008/0149980 A1 | 6/2008 | Govindarajan |
| 2013/0105915 A1* | 5/2013 | Wu .................. H01L 21/02186 257/402 |
| 2014/0065798 A1 | 3/2014 | Ahmed et al. |
| 2014/0264443 A1 | 9/2014 | Vellianitis |
| 2014/0367801 A1* | 12/2014 | Liu .................. H01L 29/42376 257/407 |
| 2015/0144999 A1 | 5/2015 | Ching et al. |
| 2015/0279954 A1 | 10/2015 | Chen et al. |
| 2015/0340286 A1 | 11/2015 | Zhu et al. |
| 2016/0126331 A1 | 5/2016 | Lee et al. |
| 2016/0314963 A1* | 10/2016 | Choi .................... H01L 21/324 |
| 2017/0054023 A1 | 2/2017 | Li et al. |

OTHER PUBLICATIONS

C.-T. Chang et al., "Preferential Oxidation of Si in SiGe for Shaping Ge-Rich SiGe Gate Stacks," IEEE International Electron Devices Meeting (IEDM), Dec. 2015, pp. 21.5.1-21.5.4.

T. Yu et al., "Effect of NH3 Plasma Treatment on the Interfacial Property Between Ultrathin HfO2 and Strained Si0.65Ge0.35 Substrate," Journal of Applied Physics, Jan. 2013, pp. 044105-1-044105-7, vol. 113, No. 4.

List of IBM Patents or Patent Applications Treated as Related.

* cited by examiner

FORMATION OF PURE SILICON OXIDE INTERFACIAL LAYER ON SILICON-GERMANIUM CHANNEL FIELD EFFECT TRANSISTOR DEVICE

TECHNICAL FIELD

This disclosure generally relates to semiconductor fabrication techniques and, in particular, techniques for fabricating FET (field effect transistor) devices.

BACKGROUND

One of the promising dual channel CMOS (complementary metal-oxide-semiconductor) integrations schemes for current and future technology nodes is to utilize tensile-strained silicon (Si) channels for n-type FET (field effect transistor) devices and to utilize compressively-strained silicon-germanium (SiGe) channels for p-type FET devices. The use of SiGe channels for p-type MOSFET devices is known to enhance the carrier (hole) mobility as compared to Si alone. For CMOS technologies, silicon dioxide ($SiO_2$) has traditionally been used as the gate dielectric for MOSFET devices. As the dimensions of MOSFET devices continue to shrink, however, the thickness of the $SiO_2$ gate dielectric layer must also decrease to maintain the requisite capacitance between the control gate and channel. However, the scaling of $SiO_2$ gate dielectric layers (e.g., 2 nm or less) poses problems in that leakage current through the gate dielectric increases exponentially with the decrease in the thickness of the gate dielectric. As such, high-k gate dielectrics have been utilized in place of $SiO_2$ to enable thicker gate dielectric layers to reduce leakage, while allowing scaling down of the EOT (equivalent oxide thickness) of the gate dielectric.

The use of high-k gate dielectric materials is problematic in that such dielectric materials typically do not interface well with silicon layers. For example, high-k gate dielectric materials do not passivate a silicon surface, which results in a large number of interface traps and charges and other issues which can degrade device performance. As such, high-k dielectric gate materials are often used in conjunction with a thin interfacial silicon oxide layer which provides an interface between the silicon channel layer and the high-k gate dielectric layer. However, the optimization of a silicon oxide interfacial layer between a high-k dielectric layer and a SiGe channel layer is non-trivial due to the complexity arising from the coexistence of Si and Ge interfacial oxides.

For example, SiGe channel FETs are known to have a high interface trap charge (Nit) at the interface between the interfacial layer and the surface of the SiGe channel layer, which might be attributed to undesired formation of germanium oxide ($GeO_x$). The resulting mixed $SiO_x/GeO_x$ interface causes large interface trap densities due to distorted Ge—O bonds across the interface. While nitridation of the silicon oxide layer is known to be effective to suppress $GeO_x$ formation, the nitridation of silicon oxide is also problematic in that the nitridation of the silicon oxide causes an increase in the interface trap charge density and mobility degradation. The presence of defective high-k/SiGe interfaces limits the performance of SiGe-channel FET devices.

SUMMARY

Embodiments of the invention include methods to form a pure silicon oxide layer on a SiGe layer, as well as SiGe-channel FET devices comprising a pure silicon oxide interfacial layer of a metal gate structure formed on a SiGe channel layer of the FET device.

For example, one embodiment includes a method for fabricating a semiconductor device, which comprises: growing a first silicon oxide layer on a first surface region of a SiGe layer using a first oxynitridation process, wherein the first silicon oxide layer comprises nitrogen; removing the first silicon oxide layer from the SiGe layer; and growing a second silicon oxide layer on the first surface region of the SiGe layer using a second oxynitridation process, which is substantially the same as the first oxynitridation process, wherein the second silicon oxide layer is substantially devoid of germanium oxide and nitrogen. In one embodiment, the first silicon oxide layer comprises a silicon oxynitride (SiON) layer that is grown on the first surface region of the SiGe layer, and the second silicon oxide layer comprises a pure silicon dioxide layer that is grown on the first surface region of the SiGe layer channel layer of a FET (field effect transistor) device.

Another embodiment includes a method for fabricating a semiconductor device. The method includes forming a dummy gate structure on a SiGe channel layer of a FET device, and performing a RMG (replacement metal gate) process which comprises removing the dummy gate structure from the SiGe channel layer, and forming a metal gate structure on the SiGe channel layer. The dummy gate structure is formed by a process which comprises: growing a dummy silicon oxide layer on a surface of the SiGe channel layer using a first oxynitridation process, wherein the dummy silicon oxide layer comprises nitrogen; and forming a dummy gate electrode layer over the dummy silicon oxide layer. The metal gate structure is formed on the SiGe channel layer by a process which comprises: growing an interfacial silicon oxide layer on the surface of SiGe channel layer using a second oxynitridation process, which is substantially the same as the first oxynitridation process, wherein the interfacial silicon oxide layer is substantially devoid of germanium oxide and nitrogen; forming a high-k dielectric layer on the interfacial silicon oxide layer, wherein k is greater than 4; and forming a metal gate electrode layer on the high-k dielectric layer. In one embodiment, the dummy silicon oxide layer comprises a SiON layer grown on the SiGe channel layer, and the interfacial silicon oxide layer comprises a pure silicon dioxide layer grown on the surface of the SiGe channel layer.

Another embodiment includes a semiconductor device. The semiconductor device comprises a FET device formed on a semiconductor substrate. The FET device comprises a SiGe channel layer, and a metal gate structure formed on the SiGe channel layer. The metal gate structure comprises: an interfacial silicon oxide layer grown on a surface of the SiGe channel layer using a oxynitridation process, wherein the interfacial silicon oxide layer is substantially devoid of germanium oxide and nitrogen; a high-k dielectric layer formed on the interfacial silicon oxide layer, wherein k is greater than 4; and a metal gate electrode layer formed over the high-k dielectric layer. In one embodiment, the interfacial silicon oxide layer comprises a pure silicon dioxide layer.

Other embodiments will be described in the following detailed description of embodiments, which is to be read in conjunction with the accompanying figures.

BRIEF DESCRIPTION OF THE DRAWINGS

FIGS. 2 through 13 schematically illustrate a method for fabricating the semiconductor device of FIG. 1, according to an embodiment of the invention, wherein:

FIG. 2 schematically illustrates the semiconductor device of FIG. 1 at an intermediate stage of fabrication after forming shallow trench isolation regions on a semiconductor substrate;

FIG. 3 is a schematic cross-sectional side view of the semiconductor structure of FIG. 2 after sequentially forming a first silicon oxide layer, a second silicon oxide layer, and a polysilicon layer on the semiconductor substrate;

FIG. 4 is a schematic cross-sectional side view of the semiconductor structure of FIG. 3 after patterning the polysilicon layer to form a gate poly layer of a dummy gate structure;

FIG. 5 is a schematic cross-sectional side view of the semiconductor structure of FIG. 4 after etching the first and second silicon oxide layers using the gate poly layer as an etch mask to form dummy oxide layers of the dummy gate structure;

FIG. 6 is a schematic cross-sectional side view of the semiconductor structure of FIG. 5 after forming first and second source/drain regions in the semiconductor substrate adjacent the dummy gate structure;

FIG. 7 is schematic cross-sectional side view of the semiconductor structure of FIG. 6 after forming insulating spacers on sidewalls of the dummy gate structure;

FIG. 8 is schematic cross-sectional side view of the semiconductor structure of FIG. 7 after forming silicide layers on the first and second source/drain regions;

FIG. 9 is schematic cross-sectional side view of the semiconductor structure of FIG. 8 after depositing and planarizing a layer of insulating material;

FIG. 10 is schematic cross-sectional side view of the semiconductor structure of FIG. 9 after removing the dummy gate structure as part of a replacement metal gate process to form a recess between the insulating sidewall spacers;

FIG. 11 is schematic cross-sectional side view of the semiconductor structure of FIG. 10 after forming a silicon oxide layer on a surface of the SiGe channel region of the FET device;

FIG. 12 is schematic cross-sectional side view of the semiconductor structure of FIG. 11 after depositing a conformal layer of gate dielectric material and a conformal layer of work function metal to form a high-k metal gate stack structure; and FIG. 13 is schematic cross-sectional side view of the semiconductor structure of FIG. 12 after depositing a layer of metallic material to fill a recess between the insulating sidewall spacers to form a metal gate electrode layer.

DETAILED DESCRIPTION

Embodiments will now be described in further detail with regard to methods for forming a pure silicon oxide interfacial layer on a SiGe channel of an FET device, as well as SiGe channel FET devices that are formed using such methods. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Figure 1:
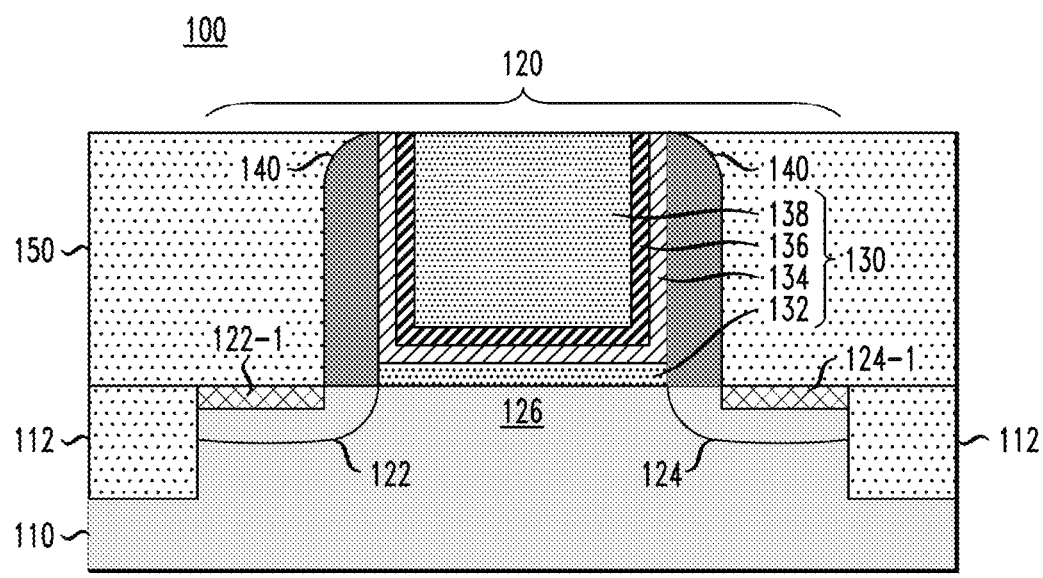
FIG. 1 is schematic cross-sectional side view of a semiconductor device comprising a SiGe-channel FET device according to an embodiment of the invention.

FIG. 1 is schematic cross-sectional side view of a semiconductor device 100 comprising a SiGe-channel FET device according to an embodiment of the invention. In particular, the semiconductor device 100 comprises a semiconductor substrate 110 and a SiGe channel FET device 120 formed on the semiconductor substrate 110. The semiconductor substrate 110 comprises shallow trench isolation (STI) regions 112 to isolate the FET device 120 from adjacent active device regions formed on the semiconductor substrate 110. The FET device 120 comprises a first source/drain region 122, a second source/drain region 124, and a SiGe channel region 126, which are formed as part of the substrate 110. The FET device 120 further comprises silicide contacts 122-1 and 124-1 formed on the respective first and second source/drain regions 122 and 124, a gate structure 130 formed on the SiGe channel region 126, and insulating spacers 140 disposed on sidewalls of the gate structure 130. The semiconductor device 100 further comprises an insulating layer 150 (e.g., a PMD (pre-metal dielectric) layer)). The gate structure 130 comprises a silicon oxide interfacial layer 132, a high-k metal gate stack structure 134/136, and a metal gate electrode layer 138. The high-k metal gate stack structure 134/136 comprises a high-k dielectric layer 134 and a work function metal layer 136.

As explained in further detail below, in one embodiment of the invention, the gate structure 130 is formed as part of a RMG (replacement metal gate) process flow which is configured to enable formation of a pure silicon oxide interfacial layer 132 on the SiGe channel region 126, wherein the pure silicon oxide interfacial layer 132 is substantially devoid of nitrogen (N) and $GeO_x$ material. The pure silicon oxide interfacial layer 132 is formed by a process which generally comprises growing a first silicon oxide layer (e.g. dummy gate oxide layer) on the surface of the SiGe channel region 126 using a first oxynitridation process, wherein the first silicon oxide layer comprises germanium oxide and nitrogen. The first silicon oxide layer is removed from the surface of the SiGe channel region 126, and the interfacial silicon oxide layer 132 is formed by growing the interfacial silicon oxide layer 132 on the surface of the SiGe channel region 126 using a second oxynitridation process, which is the same or substantially the same as the first oxynitridation process, to form a pure silicon oxide interfacial layer which is substantially devoid of germanium oxide and nitrogen.

The second oxide layer (e.g., pure silicon oxide layer 132) that is formed on the SiGe channel region 126 serves as a silicon oxide interfacial layer between the SiGe channel region 126 and the high-k gate dielectric layer 134 of the gate structure 130. As explained in further detail below, the first (dummy) oxide layer is reactively grown using a first oxynitridation process that effectively treats the surface of the SiGe channel region 126 in a way that essentially prevents the formation of $GeO_x$ and prevents the incorporation of nitrogen within the pure silicon oxide interfacial layer 132 that is subsequently grown on the surface of the SiGe channel region 126 by performing the second oxynitridation process, which is the same or substantially the same as the first oxynitridation process.

Figure 2:
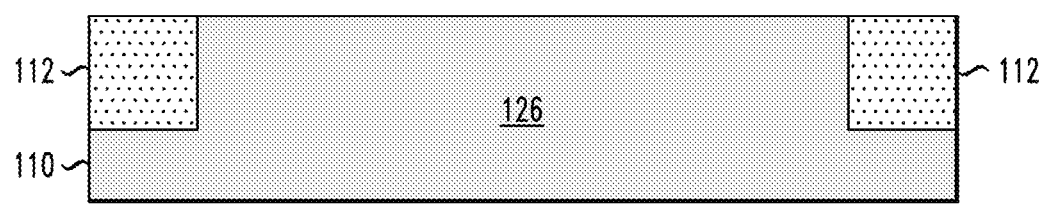

Various methods for fabricating the semiconductor device 100 of FIG. 1 will now be discussed in further detail with reference to FIGS. 2 through 13, which schematically illustrate different stages of a process flow for fabricating the semiconductor device 100 of FIG. 1, according to an embodiment of the invention. To begin, FIG. 2 schematically illustrates the semiconductor device of FIG. 1 at an intermediate stage of fabrication after forming STI regions 112 on the semiconductor substrate 110. For ease of illustration, FIG. 2 shows one device region, which is defined by the STI regions 112, for the FET device 120 shown in FIG. 1. The semiconductor substrate 110 is illustrated as a generic substrate layer, and may comprise different types of semiconductor substrate structures.

For example, in one embodiment, the semiconductor substrate 110 comprises a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 110 comprises a SOI (silicon on insulator) substrate, which comprises an insulating layer (e.g., oxide layer) disposed between a base substrate layer (e.g., silicon substrate) and an active semiconductor layer (e.g., active Si or SiGe layer) in which the active circuit components are formed as part of a FEOL (front end of line) structure.

For the bulk and SOI substrate embodiments, the SiGe channel region 126 may comprise an active SiGe layer at the surface of the bulk or SOI substrate. For example, the SiGe channel region 126 may comprise a crystalline epitaxial SiGe layer that is grown on top of a bulk silicon substrate or a bulk germanium substrate. The crystalline SiGe layer can be epitaxially grown using known techniques, such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metalorganic molecular beam epitaxy), or other known epitaxial growth techniques.

A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on silicon substrate layer. A strained-Si/relaxed-SiGe structure produces tensile strain which primarily improves electron mobility for n-type FET devices, while a strained-SiGe/relaxed-Si structure produces a compressive strain which primarily improves hole mobility for p-type FET devices.

In accordance with embodiments of the invention, the Ge content of a SiGe channel layer can be adjusted to achieve target properties/characteristics of the SiGe-channel FET device. For example, it is known that that a bandgap of a SiGe channel layer can be decreased by increasing the Ge content of the silicon-germanium alloy, e.g., the band gap decreases from 1.12 eV (pure silicon) to 0.66 eV (pure germanium) at room temperature. In accordance with embodiments of the invention as discussed herein, the Ge content of the SiGe channel region 126 is in a range of about 20% to about 70%.

As noted above, the STI regions 112 are initially formed in the surface of the semiconductor substrate 110 to define device regions. The STI regions 112 can be formed using a standard technique which involves, e.g., etching a pattern of trenches in the surface of the substrate 110, depositing one or more insulating/dielectric materials (such silicon nitride, or silicon dioxide) to fill the trenches, and then removing the excess insulating/dielectric material using a technique such as chemical-mechanical planarization (CMP). The STI regions 112 are formed to define a plurality of isolated device regions in which FETs according to embodiments of the invention are formed.

Figure 3:
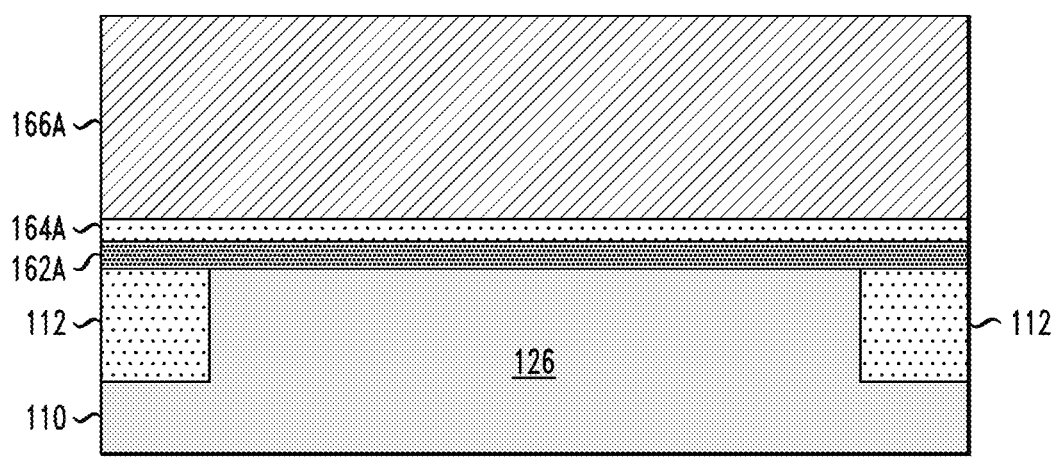
Figure 4:
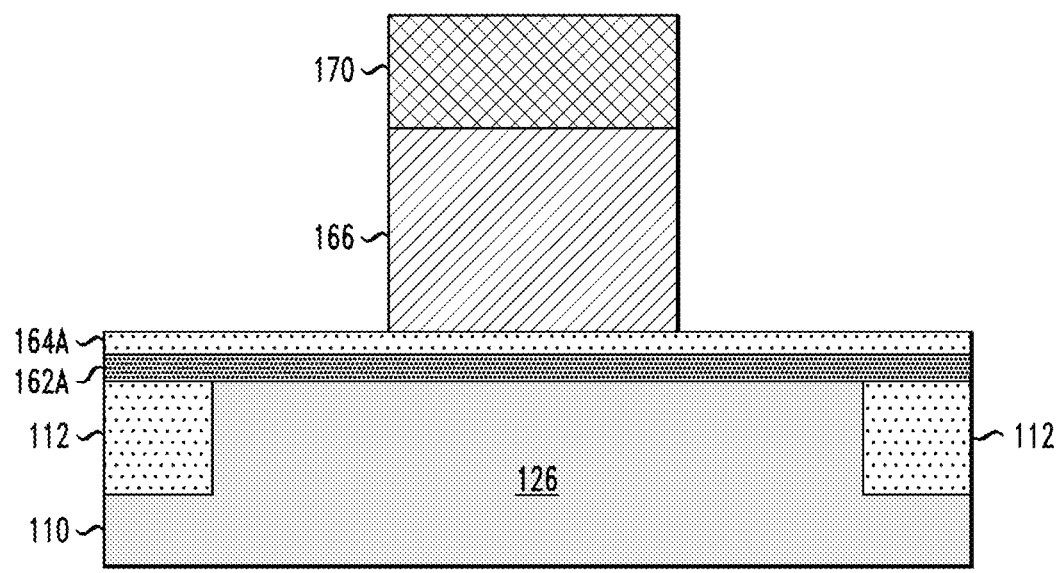
Figure 5:
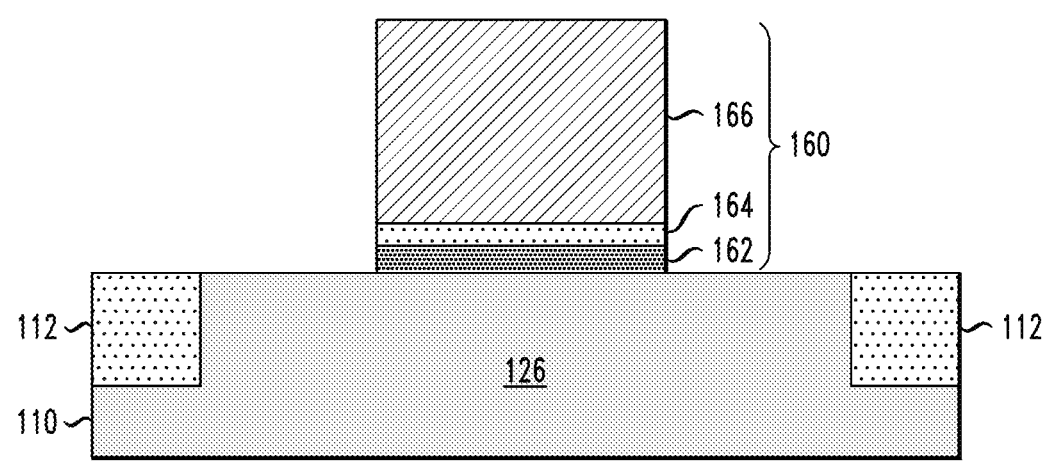

A next phase of the fabrication process comprises forming a dummy gate structure using an exemplary process flow as schematically illustrated in FIGS. 2, 3, 4 and 5. To begin, FIG. 3 is a schematic cross-sectional side view of the semiconductor structure of FIG. 2 after sequentially forming a first silicon oxide layer 162A, a second silicon oxide layer 164A, and a polysilicon layer 166A on the semiconductor substrate 110. These layers 162A, 164A, and 166A are subsequently patterned to form a dummy gate structure 160 (FIG. 5).

As shown in FIG. 3, the first silicon oxide layer 162A is formed on the surface of the SiGe channel region 126 of the semiconductor substrate 110. In one embodiment of the invention, the first silicon oxide layer 162A comprises a silicon oxynitride (SiON) reacted layer that is formed by nitriding and oxidizing (referred to herein as "oxynitridation") the surface of the semiconductor structure shown in FIG. 2 to form an SiON layer. In one embodiment, the oxynitridation process is performed by performing a first rapid thermal annealing (RTA) process in a gas mixture atmosphere comprising ammonia ($NH_3$), at a volumetric flow rate of about 5 slm (standard liter per minute), at a temperature in a range of about 600° C. to about 800° C., for a period of about 10 seconds to about 60 seconds, and at a pressure in a range of about 100 Torr to about 760 Torr. The first RTA process is followed by a second RTA process in a gas mixture atmosphere comprising oxygen (e.g., $O_2$ at a volumetric flow rate of about 1 slm, and $N_2$ at a volumetric flow rate of about 9 slm), at a temperature in a range of about 600° C. to about 800° C., for a period of about 10 seconds to about 60 seconds, and at a pressure in a range of about 100 Torr to about 760 Torr. The first silicon oxide layer 162A (e.g., SiON layer) is formed with a thickness in a range of about 5 angstroms to about 20 angstroms.

The first silicon oxide layer 162A is subsequently patterned to form a dummy gate oxide layer of the dummy gate structure 160 (FIG. 5). While the dummy gate oxide layer is subsequently removed as part of a RMG process, the formation of the first silicon oxide layer 162A (e.g., SiON layer) serves to chemically treat the surface of the SiGe channel region 126 of the semiconductor substrate 110 in such a way as to enable the formation of a pure silicon oxide interfacial layer on the SiGe channel region 126 using essentially the same RTA oxynitridation process that was used to form the first silicon oxide layer 162A, but wherein the resulting silicon oxide interfacial layer is substantially devoid of $GeO_x$ and nitrogen.

Furthermore, in one embodiment of the invention, the second silicon oxide layer 164A comprises a silicon oxide material (e.g., such as silicon dioxide) which is deposited on top of the first silicon oxide layer 162A using a deposition process such as ALD (atomic layer deposition) or CVD. The second silicon oxide layer 164A is formed with a thickness in a range of about 1 nm to about 5 nm. It is to be understood that the second silicon oxide layer 164A is an optional layer that may be formed to serve as an etch buffer layer during a dry plasma etch (e.g. RIE (Reactive Ion Etch)) that is performed in a subsequent etch process to pattern the polysilicon layer 166A and form a dummy gate poly layer 166 (FIG. 4).

The polysilicon layer 166A comprises a polycrystalline silicon material that is deposited using known methods such as CVD, physical vapor deposition (PVD), electro-chemical deposition, and other suitable deposition methods. In one embodiment, the polysilicon layer 166A is deposited with a thickness in a range of about 30 nm to about 100 nm. The stack of layers 162A, 164A, and 166A is patterned to form a dummy gate structure using an etch process flow as shown in FIGS. 4 and 5.

In particular, FIG. 4 is a schematic cross-sectional side view of the semiconductor structure of FIG. 3 after patterning the polysilicon layer 166A to form a dummy poly gate layer 166 of the dummy gate structure 160. In one embodiment, the polysilicon layer 166A is patterned using a standard photolithography process, which comprises forming a photoresist mask 170 to cover a portion of the polysilicon layer 166A which defines a target footprint of the dummy poly gate layer 166, followed by a dry etch process (e.g., RIE) to anisotropically etch away the regions of the polysilicon layer 166A exposed through the photoresist mask 170, resulting in the semiconductor structure shown in FIG. 4. The poly etch process is performed selective to the oxide material of the underlying second silicon oxide layer 164A, so that the second silicon oxide layer 164A serves as an etch stop and buffer layer to prevent the poly etch process from etching though the first silicon oxide layer 162A and damaging the semiconductor material of the SiGe channel region 126.

In particular, in the absence of the second silicon oxide layer 164A, since the first silicon oxide layer 162A is very thin, there is some chance that the poly etch process would result in etching through the exposed portion of the first silicon oxide layer 162A into the SiGe channel region 126, which is undesirable. In this regard, the second silicon oxide layer 164A, which is deposited on top of the first silicon oxide layer 162A, serves as a buffer etch stop layer to prevent damage to the material of the SiGe channel region 126 in the event of an over etching of the poly etch process.

Next, FIG. 5 is a schematic cross-sectional side view of the semiconductor structure of FIG. 4 after etching the exposed portions of the first and second silicon oxide layers 162A and 164A using the dummy gate poly layer 166 as an etch mask to form dummy oxide layers 162 and 164. This oxide etch process results in the formation of the dummy gate structure 160 on top of a portion of the SiGe channel 126 of the semiconductor substrate 110, as shown in FIG. 5. In this process, the oxide materials of the first and second silicon oxide layers 162A and 164A are etched highly selective to the materials of the dummy poly gate layer 166, and the SiGe channel region 126.

Figure 6:
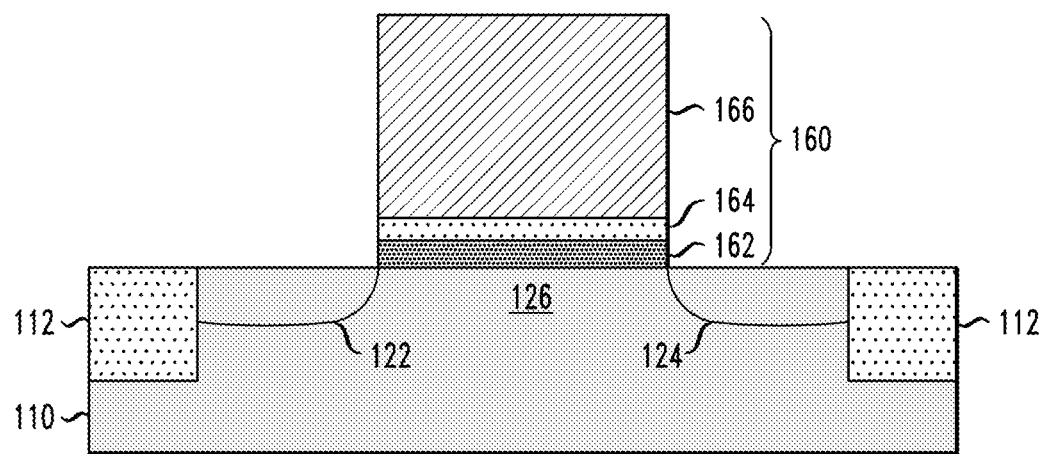

FIG. 6 is a schematic cross-sectional side view of the semiconductor structure of FIG. 5 after forming the first and second source/drain regions 122 and 124 in areas of the semiconductor substrate 110 adjacent to the dummy gate structure 160. The first and second source/drain regions 122 and 124 can be formed by doping the surface of the semiconductor substrate 110 using ion implantation techniques. In particular, the source/drain regions 122 and 124 can be formed by doping the exposed surface portions of the active layer of the semiconductor substrate 110 with Group III elements (for P-type FET devices) or Group V elements (for N-type FET devices). Typical dopants include Boron, Arsenic, Phosphorus, Gallium, Antimony, etc. For example, boron is a p-type dopant, whereas phosphorus is an n-type dopant. It is to be understood that the term "source/drain region" as used herein means that a given source/drain region can be either a source region or a drain region, depending on the application. For example, in one embodiment, the first source/drain region 122 is a drain region, and the second source/drain region 124 is a source region, and vice versa. It is to be understood that the first and second source/drain regions 122 and 124 are generically depicted in FIG. 6, and that the first and second source drain regions 122 and 124 can be formed with one of a myriad of different types of profiles/structures (e.g., Halo regions, extended regions, lightly doped/heavily doped regions, etc.)

Figure 7:
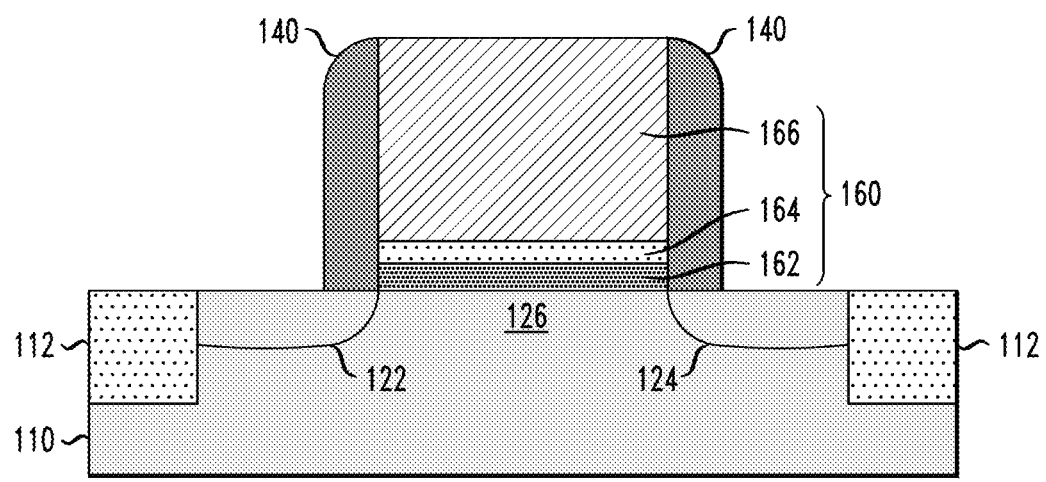

Next, FIG. 7 is schematic cross-sectional side view of the semiconductor structure of FIG. 6 after forming the insulating spacers 140 on the sidewalls of the dummy gate structure 160. The insulating spacers 140 can be fabricated using known methods. For example, the insulating spacers 140 can be fabricated by depositing a conformal layer of insulating material, such as silicon nitride, over the semiconductor structure of FIG. 6 to conformally cover the dummy gate structure 160 with the insulating material (e.g., SiN). The conformal layer of insulating material is then photolithographically patterned or otherwise anisotropically etched (e.g., directional RIE etch) to remove the conformal layer of insulating material from the surface of the semiconductor substrate 110 (to expose the source/drain regions 122 and 124), while leaving insulating material on the sidewalls of the gate structures 160 to form the sidewall spacers 140. Although not specifically shown in FIG. 7, the conformal layer of insulating material can be patterned to leave a thin capping layer on the top surface of the dummy gate structure 160 to prevent formation of a silicide layer on the upper surface of the dummy poly gate layer 166 during a subsequent salicidation process to form the silicide layers 122-1 and 124-1, as shown in FIG. 8.

Figure 8:
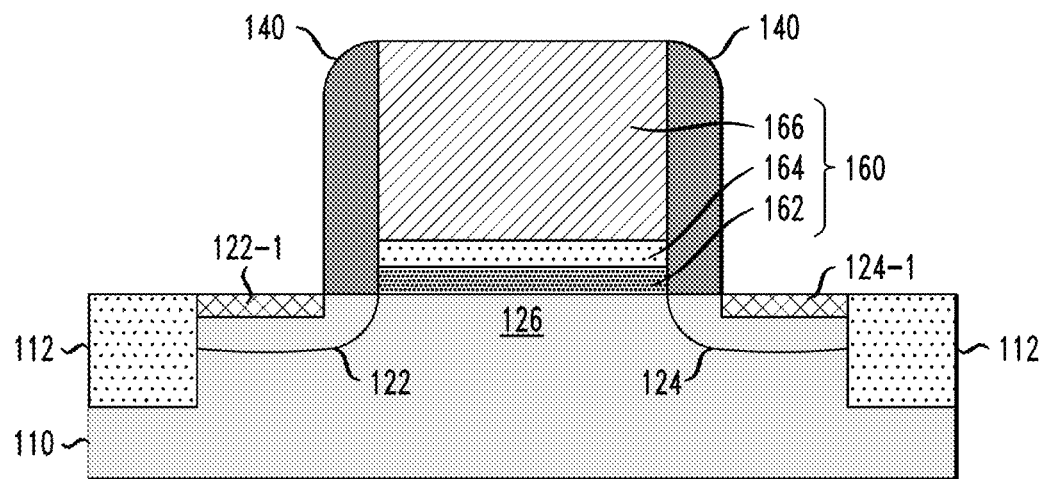

In particular, FIG. 8 is schematic cross-sectional side view of the semiconductor structure of FIG. 7 after forming the silicide layers 122-1 and 124-1 on the first and second source/drain regions 122 and 124, respectively. The silicide layers 122-1 and 124-1 can be formed using known techniques. For example, a layer of metallic material is conformally deposited over the semiconductor structure of FIG. 7 using ALD or other suitable deposition methods (e.g., PVD, CVD, etc.). The layer of metallic material can include a transition metal such as nickel (Ni), cobalt (Co), titanium (Ti), platinum (Pt), tungsten (W), tantalum (Ta), an alloy such as TiAl or TiN, etc., or any other suitable metallic material. Prior to deposition of the layer of metallic material, a preclean process can be performed to remove any surface impurities or oxides from the exposed surfaces of the source/drain regions 122 and 124. A thermal anneal process is then performed at an appropriate temperature to induce a reaction between the semiconductor material of the source/drain regions 122 and 124 and the metallic material to form the silicide layers 122-1 and 124-1 on the respective source/drain regions 122 and 124. Following the formation of the silicide layers 122-1 and 124-1, the remaining unreacted metallic material is removed using a wet etch process, resulting in the semiconductor structure shown in FIG. 8.

Figure 9:
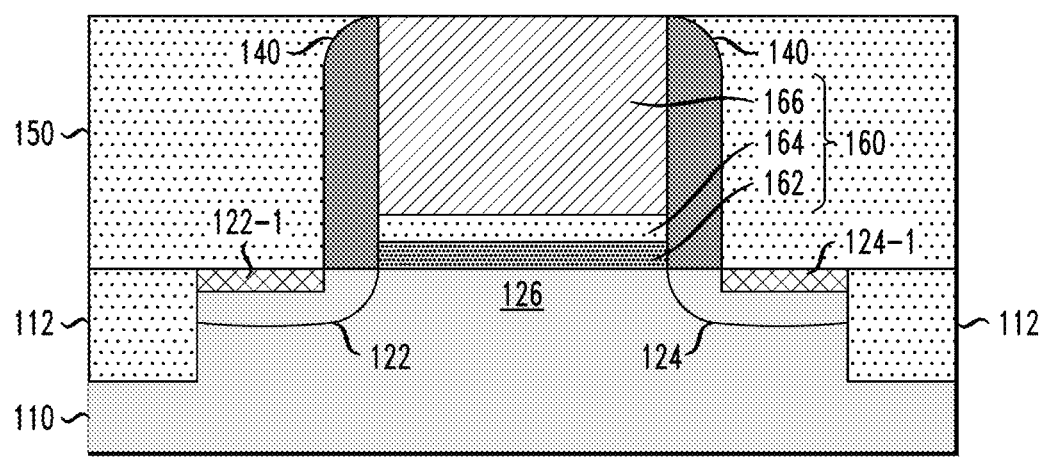

Next, FIG. 9 is schematic cross-sectional side view of the semiconductor structure of FIG. 8 after depositing and planarizing a layer of insulating material to form the PMD layer 150 (or ILD (interlevel dielectric layer)). In one embodiment, as shown in FIG. 9, the planarizing process is performed to planarize the surface of the semiconductor structure down to the upper surface of the dummy gate structure 160. The insulating layer 150 can be formed of a dielectric material including, but not limited to, silicon oxide (e.g. SiO2), silicon nitride (e.g., (Si3N4), hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). The insulating layer 150 may be deposited using known deposition techniques, such as, for example, ALD, CVD, PECVD (plasma-enhanced CVD), or PVD, or spin-on deposition.

Figure 10:
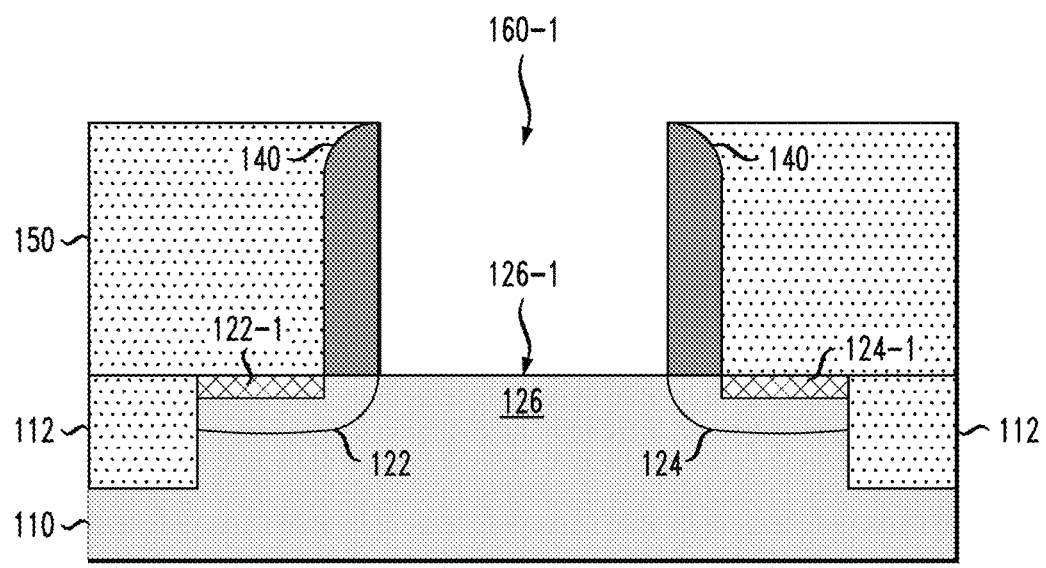

A next phase of the semiconductor fabrication process comprises performing a replacement metal gate process as schematically illustrated in FIGS. 10, 11, 12, and 13. In particular, as a first step of the replacement metal gate process, FIG. 10 is schematic cross-sectional side view of the semiconductor structure of FIG. 9 after removing the dummy gate structure 160 to form a recess 160-1 between the insulating sidewall spacers 140, which exposes a surface 126-1 of the SiGe channel region 126 at a bottom of the recess 160-1. In one embodiment, the dummy gate structure 160 can be removed by performing a wet etch process using, e.g., a TetraMethyl Ammonium Hydroxide (TMAH) chemical etch solution, to etch away the dummy poly gate layer 166 selective to the insulating materials (e.g., SiO2, Si3N4, hafnium silicon oxynitride (HfSiON)) of the surrounding layers and features (e.g., 150, 140, 164, 162). The remaining first and second dummy oxide layers 162 and 164 of the dummy gate structure 160 are then removed using an oxide etch process, which is selective to the insulating materials (e.g., SiN) of the insulating sidewall spacers 140, and selective to the SiGe material of the portion of the SiGe channel region 126 exposed at the bottom of the recess 160-1.

Figure 11:
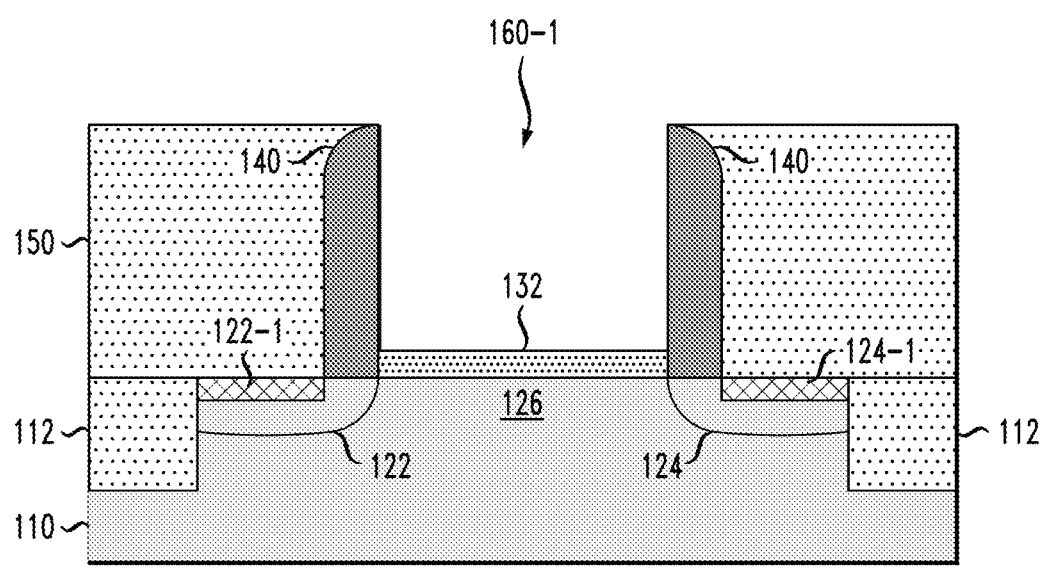
Figure 12:
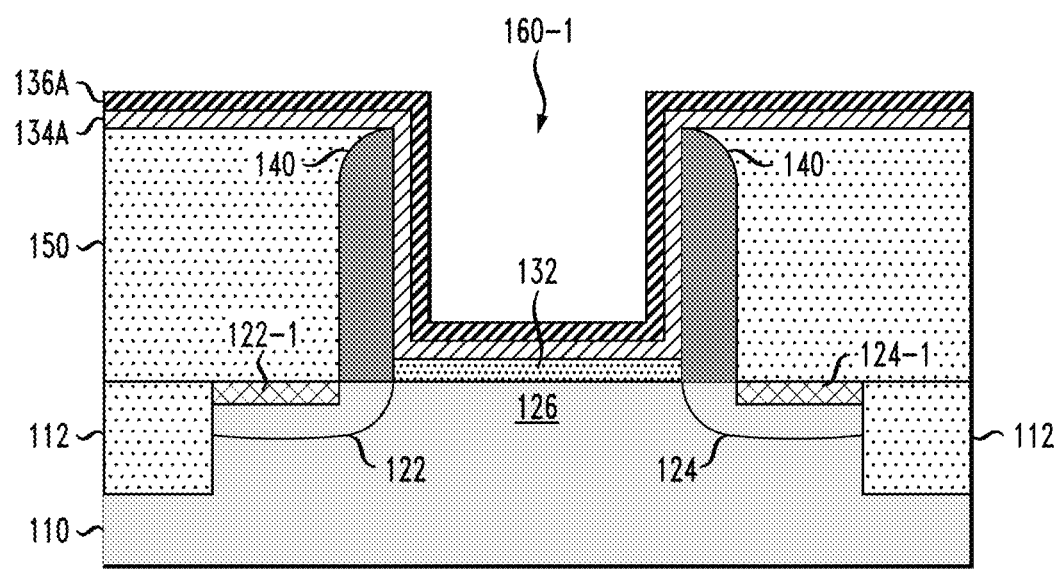
Figure 13:
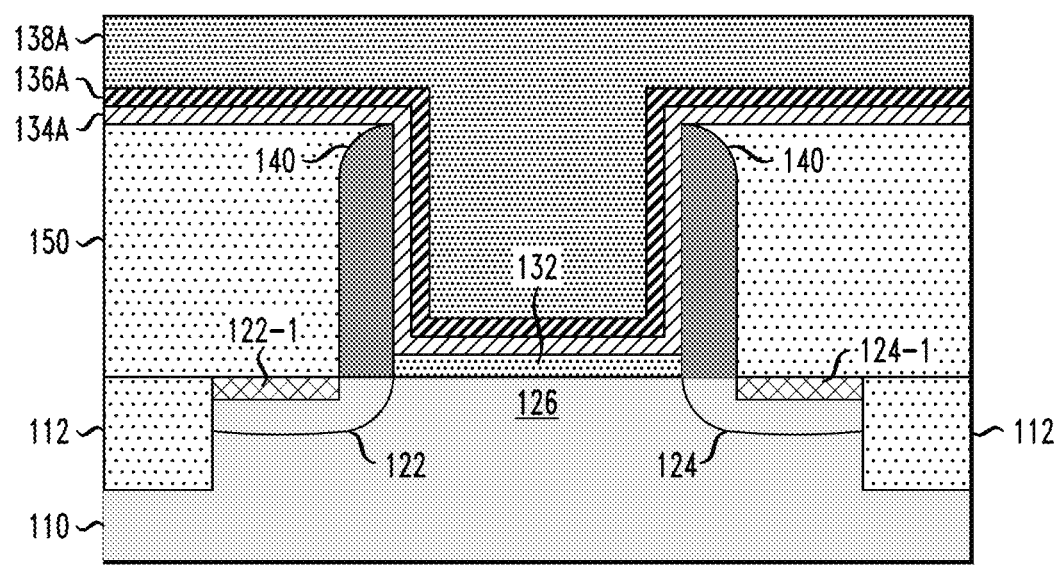

After removing the dummy gate structure 160, the metal gate structure 130 (FIG. 1) is formed by a process that is schematically illustrated in FIGS. 11, 12 and 13. For example, as an initial step, FIG. 11 is schematic cross-sectional side view of the semiconductor structure of FIG. 10 after forming the silicon oxide interfacial layer 132 on the exposed surface 126-1 of the SiGe channel region 126. In one embodiment of the invention, the silicon oxide interfacial layer 132 comprises a pure SiO2 interfacial layer which is formed using the same or similar oxynitridation RTA process used to form the dummy gate oxide layer 162 of the dummy gate structure 160. For example, the silicon oxide interfacial layer 132 comprises a reacted layer that is formed by performing a first RTA process in a gas mixture atmosphere comprising ammonia ($NH_3$), at a volumetric flow rate of about 5 slm, at a temperature in a range of about 600° C. to about 800° C., for a period of about 10 seconds to about 60 seconds, and at a pressure in a range of about 100 Torr to about 760 Torr. The first RTA process is followed by a second RTA process in a gas mixture atmosphere comprising oxygen (e.g., $O_2$ at a volumetric flow rate of about 1 slm, and $N_2$ at a volumetric flow rate of about 9 slm), at a temperature in a range of about 600° C. to about 800° C., for a period of about 10 seconds to about 60 seconds, and at a pressure in a range of about 100 Torr to about 760 Torr. The silicon oxide interfacial layer 132 is formed with a thickness in a range of about 5 angstroms to about 20 angstroms.

While the initial oxynitridation RTA process resulted in the formation of the first (dummy) silicon oxide layer 162A (FIG. 3) comprising SiON, the second oxynitridation RTA process (FIG. 11) results in the formation a pure silicon dioxide ($SiO_2$) interfacial layer that is substantially devoid of $GeO_x$ and nitrogen. As noted above, the initial oxynitridation RTA process used to form the SiON silicon oxide layer 162A (for the dummy gate structure 160) serves to chemically treat the surface 126-1 of the SiGe channel region 126 of the semiconductor substrate 110 in such a way as to enable the formation of a pure silicon oxide interfacial layer 132 on the surface 126-1 of the SiGe channel region 126 using essentially the same RTA oxynitridation process that was used to form the first silicon oxide layer 162A, but wherein the resulting silicon oxide interfacial layer 132 is substantially devoid of $GeO_x$ and nitrogen.

After forming the silicon oxide interfacial layer 132, the process continues with forming the high-k metal gate stack structure 134/146 and the metal gate electrode layer 138 of the metal gate structure 130 shown in FIG. 1. For example, FIG. 12 is schematic cross-sectional side view of the semiconductor structure of FIG. 11 after depositing a conformal layer of gate dielectric material 134A and a conformal layer of work function metal 136A, which are subsequently patterned to form the high-k metal gate stack structure 134/136 of the gate structure 130 (FIG. 1). Further, FIG. 13 is schematic cross-sectional side view of the semiconductor structure of FIG. 12 after depositing a layer of metallic material 138A to fill the recess 160-1 between the insulating sidewall spacers 140, which is subsequently patterned to form the metal gate electrode layer 138 of the gate structure 130 (FIG. 1).

In one embodiment, the conformal layer of gate dielectric material 134A is formed, for example, by depositing one or more conformal layers of dielectric material over the surface of the semiconductor structure of FIG. 11. The type of dielectric material(s) used to form the conformal layer of gate dielectric material 134A will vary depending on the application. For example, the conformal layer of gate dielectric material 134A may comprise, e.g., nitride, oxynitride, or oxide or high-k materials (having a k-value greater than about 4). For example, the gate dielectric material may include a high-k dielectric material such as $Ta_2O_5$, $TiO_2$, $Al_2O_3$, $ZrO_2$, $Y_2O_3$, $L_2O_3$, $SrTiO_3$, $LaAlO_3$, or hafnium-based materials such as $HfO_2$, $HfSiO_x$, HfSiON and $HfAlO_x$, or combinations of such dielectric materials. In one embodiment of the invention, the conformal layer of gate dielectric material 134A is formed with a thickness in a range of about 0.5 nm to about 2.5 nm, which will vary depending on the target application. Further, the conformal layer of work function metal 136A may comprise one or more of, for example, Zr, W, Ta, Hf, Ti, Al, Ru, Pa, metal oxides, metal carbides, metal nitrides, transition metal aluminides (e.g. Ti₃Al, ZrAl), TaC, TiC, TaMgC, or any combination thereof. The conformal layers 134A and 136A are deposited using known methods such as ALD, CVD, or PVD, for example. Moreover, the layer of metallic material 138A may include a metallic material such as W, Al, Cu, or any metallic or conductive material that is commonly used to form gate electrode layers for FET devices.

Following the deposition of the layer of metallic material 138A, the semiconductor structure shown in FIG. 13 is planarized down to the insulating layer 150 using a planarization process such as CMP to remove the overburden material of the deposited layers 134A, 136A, and 138A, resulting in the semiconductor structure shown in FIG. 1. Thereafter, any suitable sequence of processing steps can be implemented to complete the fabrication of n-type and/or p-type FET devices and other elements of a semiconductor integrated circuit being fabricated as part of the FEOL layer, the details of which are not needed to understand embodiments of the invention. Moreover, a MOL (middle of the line) process is performed to form conductive via contacts in the PMD layer 150 (and one or more other layers of insulating material that may be formed over the PMD layer 150). The via contacts are formed by etching openings in the PMD layer 150 (and any overlying insulating layer) to expose portions of the silicide layers 122-1 and 124-1 of the source/drain regions 122 and 124, and the metal gate electrode layer 138, and then filling the openings with a conductive material to form the device contacts in the PMD layer. Following formation of the MOL device contacts, a BEOL (back end of line) interconnect structure is formed using well known fabrication process flows to provide connections between the FET devices and other active or passive devices that are formed as part of the FEOL layer.

Figure 14A:
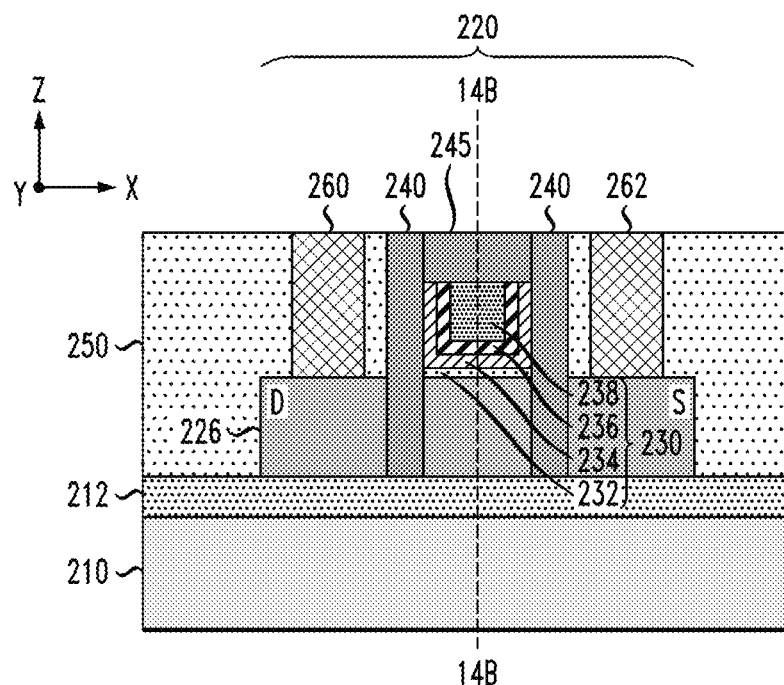
FIGS. 14A and 14B schematically illustrate a semiconductor device comprising a SiGe-channel FinFET device according to another embodiment of the invention.
Figure 14B:
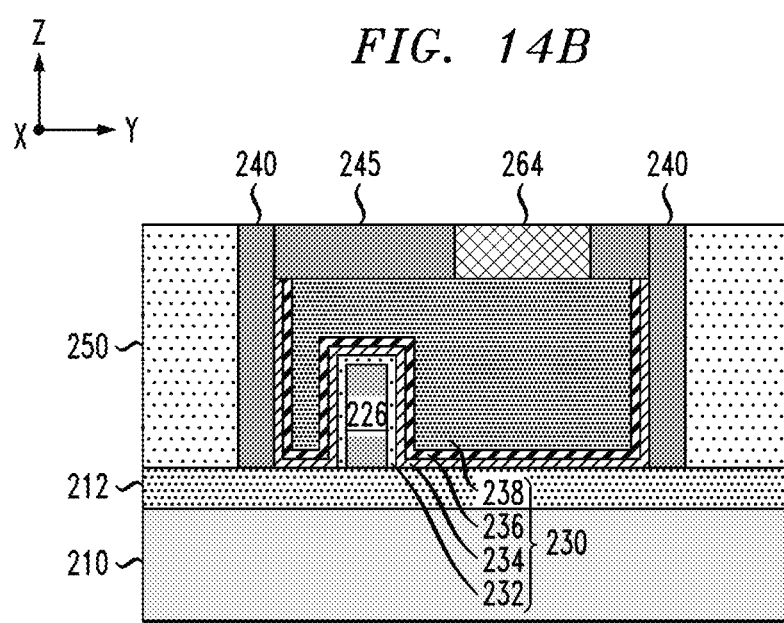

It is to be understood that the methods discussed herein for forming pure silicon oxide interfacial layers for metal gate structures can be implemented with planar FET structures as discussed above, as well as 3-D FET structures such as FinFET structures and nanowire FET structures, etc. For example, FIGS. 14A and 14B schematically illustrate a semiconductor device comprising a SiGe-channel FinFET device according to another embodiment of the invention. In particular, FIGS. 14A and 14B are schematic views of a semiconductor device 200 comprising a SiGe-channel FinFET device formed on a semiconductor substrate. FIG. 14A is a schematic side view of the semiconductor device 200, and FIG. 14B is a schematic cross-sectional view of the semiconductor device 200 taken along line 14B-14B in FIG. 14A. More specifically, FIG. 14A is a schematic side view of the semiconductor device 200 in a X-Z plane, and FIG. 14B is a cross-sectional view of the semiconductor device 200 in a Y-Z plane, as indicated by the respective XYZ Cartesian coordinates shown in FIGS. 14A and 14B. It is to be understood that the term "vertical" or "vertical direction" as used herein denotes a Z-direction of the Cartesian coordinates shown in the drawings, and the term "horizontal" or "horizontal direction" as used herein denotes an X-direction and/or Y-direction of the Cartesian coordinates shown in the drawings.

As collectively shown in FIGS. 14A and 14B, the semiconductor device 200 comprises a substrate 210/212, which comprises a bulk substrate layer 210 and an insulating layer 212 (e.g., a buried oxide layer of an SOI substrate), and a FinFET device 220. The FinFET device 220 comprises a vertical semiconductor fin 226 (which extends along the substrate 210/212 in an X direction as shown), a metal gate structure 230, insulating sidewall spacers 240, and an insulating capping layer 245. The FinFET device 220 is encapsulated in an insulating layer 250 (e.g., PMD layer of a MOL layer). The metal gate structure 230 comprises a silicon oxide interfacial layer 232, a high-k metal gate stack structure 234/236 (comprising a gate dielectric layer 234 and work function metal layer 226), and a metal gate electrode layer 238.

The vertical semiconductor fin 226 provides a vertical channel for the FinFET device 220 along a portion of the vertical semiconductor fin 226 which is encapsulated/surrounded by the metal gate structure 230. In one embodiment, the vertical semiconductor fin 226 is formed of SiGe semiconductor material. The vertical semiconductor fin 226 can be formed by etching/patterning an active SiGe layer that is formed on top of the insulating layer 212. In another embodiment, the vertical semiconductor fin 226 can be formed by patterning a SiGe layer formed on a bulk semiconductor substrate. In yet another embodiment, the vertical semiconductor fin 226 may be formed by depositing a layer of insulating material on top of a semiconductor substrate, patterning the layer of insulating material to form a trench in the insulating material which corresponds to the pattern of the vertical semiconductor fin to be fabricated, and then performing a bottom-up epitaxial growth process to grow epitaxial SiGe semiconductor material within the trench to form the vertical semiconductor fin 226. In one example embodiment of the invention, the vertical semiconductor fin 226 is formed with a vertical height in a range of about 25 nm to about 30 nm.

Furthermore, in one embodiment, the vertical semiconductor fin 226 comprises epitaxial source/drain regions (e.g., drain region (D) and source region (S) as depicted in FIG. 14A) which are epitaxially grown on the portions of the vertical semiconductor fin 226 that extend from the insulating sidewall spacers 240 of the metal gate structure 230.

The semiconductor device 200 further comprises a plurality of vertical contacts 260, 262, 264, which include a drain contact 260, a source contact 262, and a gate contact 264. The source and drain contacts 260 and 262 are formed in openings that are etched through the insulating layer 250 down to the respective drain (D) and source (S) regions of the vertical semiconductor fin 226. The gate contact 264 is formed through the gate capping layer 245 to contact the metal gate electrode layer 238 of the metal gate structure 230. The contacts 260, 262, 264 may be considered MOL device contacts that are formed as part of the MOL layer of the semiconductor device 200 to provide vertical contacts to the FinFET 220. Each MOL device contact may comprise a liner/barrier layer and a conductive via, as is known in the art. Silicide layers can be formed on source/drain regions of the vertical semiconductor fin 226 to provide ohmic contacts between the vertical semiconductor fin 226 and the vertical contacts 260 and 262.

In accordance with embodiments of the invention, the metal gate structure 230 is formed as part of a RMG process flow that is used for fabricating the FinFET device 220. In one embodiment, the RMG process flow for fabricating the FinFET device 220 implements the same or similar RMG methods discussed above for fabricating the planar FET structure. For example, a dummy gate structure is initially formed over the portion of the vertical semiconductor fin structure 226 which serves as the vertical channel. As part of this process, the surface of the SiGe vertical semiconductor fin 226 is treated by performing an initial RTA oxynitridation process to grow a conformal SiON dummy gate oxide layer over the surface of the SiGe vertical semiconductor fin 226. In one embodiment, the initial RTA oxynitridation process comprises a first RTA process in a gas mixture atmosphere comprising ammonia (NH$_3$), at a volumetric flow rate of about 5 slm, at a temperature in a range of about 600° C. to about 800° C., for a period of about 10 seconds to about 60 seconds, and at a pressure in a range of about 100 Torr to about 760 Torr. The first RTA process is followed by a second RTA process in a gas mixture atmosphere comprising oxygen (e.g., O$_2$ at a volumetric flow rate of about 1 slm, and N$_2$ at a volumetric flow rate of about 9 slm), at a temperature in a range of about 600° C. to about 800° C., for a period of about 10 seconds to about 60 seconds, and at a pressure in a range of about 100 Torr to about 760 Torr. The RTA oxynitridation process results in the formation of a reacted SiON interfacial layer formed over the surface of the SiGe semiconductor fin 226.

The dummy gate structure is completed by depositing an optional conformal silicon oxide layer over the dummy gate oxide layer, depositing a polysilicon layer, and then patterning the dummy gate oxide layers and polysilicon layer for form a dummy gate structure over the portion of the SiGe vertical semiconductor fin 226 which will serve as the vertical channel of the FinFET device 220. After forming the sidewall spacers 240 and the epitaxial source (S) and drain (D) regions on the extended portions of the vertical semiconductor fin 226, the dummy gate structure is removed, and replaced with the metal gate structure 230 shown in FIGS. 14A/14B.

With this process, the silicon oxide interfacial layer 232 is conformally grown on the sidewall and upper surfaces of the portion of the SiGe vertical semiconductor fin 226 exposed within the region between the insulating sidewall spacers 240. As with the exemplary methods discussed above, in one embodiment of the invention, the silicon oxide interfacial layer 232 comprises a pure SiO$_2$ interfacial layer which is formed using the same or similar RTA oxynitridation process used to form the SiON dummy gate oxide layer. For example, the silicon oxide interfacial layer 232 comprises a reacted layer that is formed by performing a first RTA process in a gas mixture atmosphere comprising ammonia (NH$_3$), at a volumetric flow rate of about 5 slm, at a temperature in a range of about 600° C. to about 800° C., for a period of about 10 seconds to about 60 seconds, and at a pressure in a range of about 100 Torr to about 760 Torr. The first RTA process is followed by a second RTA process in a gas mixture atmosphere comprising oxygen (e.g., O$_2$ at a volumetric flow rate of about 1 slm, and N$_2$ at a volumetric flow rate of about 9 slm), at a temperature in a range of about 600° C. to about 800° C., for a period of about 10 seconds to about 60 seconds, and at a pressure in a range of about 100 Torr to about 760 Torr. The silicon oxide interfacial layer 232 is formed with a thickness in a range of about 5 angstroms to about 20 angstroms. While the initial RTA oxynitridation RTA process results in the formation of a dummy oxide layer comprising SiON, the second RTA oxynitridation process results in the formation a pure silicon dioxide interfacial layer 232 that is substantially devoid of GeO$_x$ and nitrogen.

It is to be noted that the formation of a pure silicon dioxide interfacial layer (for metal gate structures of FET devices) using RTA oxynitridation techniques as discussed herein provide unexpected results. It is believed that the initial formation of the dummy SiON layer (using a first RTA oxynitridation process) chemically modifies the surface of the SiGe channel material in a way which prevents the bonding of Ge/O atoms and the bonding of Ge/N atoms during the second RTA oxynitridation process which is performed (as part of the RMG process) to form the silicon oxide interfacial layer (e.g., layer 132 of FIG. 1, and layer 232 of FIGS. 14A/14B) on the surface treated SiGe channel material. In particular, it is believed that the initial RTA oxynitridation process (which grows the dummy SiON layer) makes the surface of the SiGe channel region silicon-rich, which changes the binding energy of the silicon (of the silicon-rich surface) to nitrogen and to oxygen. In particular, the initial RTA oxynitridation process is believed to treat the surface of the SiGe channel region in a way that significantly increases the binding energy of silicon-to-nitrogen and the binding energy of silicon-to-oxygen, such that the second RTA oxynitridation process to form the silicon oxide interfacial layer does not result in the bonding of the silicon atoms (at the silicon-rich surface of the SiGe channel layer) to nitrogen or oxygen atom, thereby resulting in the formation of a pure silicon oxide interfacial layer that is devoid of GeO$_x$ and N.

These unexpected results have been confirmed through actual experiments. For example, the formation of a pure silicon oxide interfacial layer on a SiGe layer, which is devoid of GeO$_x$ and N, has been validated through the fabrication of metal gate structures and analysis of the fabricated structures using TEM (transmission electron microscopy) imaging in conjunction with EELS (electron energy loss spectroscopy) analysis. Furthermore, experimental results have shown that the formation of a pure silicon oxide interfacial layer on a SiGe channel layer of a FET device (as part of a RMG process as discussed herein) provides enhanced improvement in subthreshold slope (SS) and hole mobility for SiGe-channel FET devices with high Ge content (up to 70% Ge content).

In particular, experimental results have shown that SiGe-channel FET devices formed using RMG methods as discussed herein result in the formation of FET devices with a long channel subthreshold slope below 70 mV/dec, which is close to the ideal subthreshold slope of 60 mV/dec (at room temperature (300 K)) for CMOS FET devices. Moreover, experimental results have shown that SiGe-channel FET devices formed using RMG methods as discussed herein can achieve a hole mobility in a range of 250 (cm$^2$/V*s) and higher for high-Ge-content SiGe channels, while obtaining an EOT (equivalent oxide thickness) of about 0.7 nm for a composite gate dielectric stack that includes a pure silicon oxide interfacial layer and a high-k gate dielectric layer (e.g., HfO$_2$).

It is to be understood that the methods discussed herein for fabricating RMG Si—Ge-channel FET devices can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A semiconductor device, comprising:
a FET (field effect transistor) device formed on a semiconductor substrate, wherein the FET device comprises:
a silicon-germanium (SiGe) channel layer comprising a chemically treated surface; and
a metal gate structure formed on the SiGe channel layer, wherein the metal gate structure comprises:
an interfacial silicon dioxide layer grown on the chemically treated surface of the SiGe channel layer, wherein the chemically treated surface of the SiGe layer is configured to prevent formation of germanium oxide and prevent incorporation of nitrogen within the interfacial silicon dioxide layer such that the interfacial silicon dioxide layer is substantially devoid of germanium oxide and nitrogen;
a high-k dielectric layer formed on the interfacial silicon dioxide layer, wherein k is greater than 4; and
a metal gate electrode layer formed over the high-k dielectric layer.

2. The semiconductor device of claim 1, wherein the interfacial silicon dioxide layer is grown on the surface of the SiGe channel layer using an oxynitridation process which comprises performing a first rapid thermal anneal process in a gas mixture atmosphere comprising ammonia ($NH_3$) at a first temperature, and performing a second rapid thermal anneal process in a gas mixture atmosphere comprising oxygen ($O_2$) at a second temperature.

3. The semiconductor device of claim 1, wherein the SiGe channel layer comprises a Ge content in a range of about 20% to about 70%.

4. The semiconductor device of claim 1, wherein the metal gate structure further comprises a conformal work function metal layer formed on the high-k dielectric layer.

5. The semiconductor device of claim 1, wherein the FET device comprises a planar FET device.

6. The semiconductor device of claim 1, wherein the FET device comprises a three-dimensional FET device.

7. The semiconductor device of claim 6, wherein the three-dimensional FET device comprises a FinFET device.

8. The semiconductor device of claim 1, wherein the chemically treated surface of the SiGe channel layer is formed by a process which comprises:
growing a silicon oxide layer on the surface of the SiGe channel layer using a first oxynitridation process, wherein the silicon oxide layer comprises nitrogen, and wherein the growth of the silicon oxide layer using the first oxynitridation process serves to chemically treat the surface of the SiGe channel layer, and
removing the silicon oxide layer to expose the chemically treated surface of the SiGe channel layer.

9. The semiconductor device of claim 8, wherein the interfacial silicon dioxide layer is grown on the chemically treated surface of the SiGe channel layer using an oxynitridation process which is the same or similar to the first oxynitridation process.

* * * * *